United States Patent [19]

Bertin et al.

[11] Patent Number: 5,946,545
[45] Date of Patent: *Aug. 31, 1999

[54] SEMICONDUCTOR STACK STRUCTURES AND FABRICATION/SPARING METHODS UTILIZING PROGRAMMABLE SPARE CIRCUIT

[75] Inventors: Claude Louis Bertin, South Burlington; Erik Leigh Hedberg, Essex Junction; Wayne John Howell, South Burlington, all of Vt.

[73] Assignee: International Business Machines Corporation, Armonk, N.Y.

[ * ] Notice: This patent is subject to a terminal disclaimer.

[21] Appl. No.: 08/942,515

[22] Filed: Oct. 2, 1997

Related U.S. Application Data

[62] Division of application No. 08/429,981, Apr. 27, 1995, Pat. No. 5,798,282, which is a division of application No. 08/220,086, Mar. 30, 1994, Pat. No. 5,502,333.

[51] Int. Cl.$^6$ .......................... H01L 21/66; H01L 21/00; G01R 31/26
[52] U.S. Cl. .............................................. 438/15; 438/109
[58] Field of Search .................... 438/15, 109; 257/686, 257/723, 777

[56] References Cited

U.S. PATENT DOCUMENTS

| | | | |
|---|---|---|---|
| 4,312,046 | 1/1982 | Taylor | 365/104 |
| 4,697,095 | 9/1987 | Fujii | 307/243 |
| 4,731,760 | 3/1988 | Maini | 365/201 |
| 4,770,640 | 9/1988 | Walter | 439/69 |
| 4,918,335 | 4/1990 | Chall, Jr. | 307/303.1 |
| 5,008,729 | 4/1991 | Wills et al. . | |
| 5,018,104 | 5/1991 | Urai | 365/200 |
| 5,179,540 | 1/1993 | Stockton | 365/225.7 |
| 5,313,424 | 5/1994 | Adams et al. | 365/200 |
| 5,414,637 | 5/1995 | Bertin et al. | 364/489 |
| 5,798,282 | 8/1998 | Bertin et al. | 438/15 |

OTHER PUBLICATIONS

"Redundancy Using Platinum–Silicon Fuses," Fitzpatrick et al., IBM Technical Disclosure Bulletin, vol. 29, No. 10, pp. 4612–4615, Mar. 1987.

*Primary Examiner*—Brian Dutton
*Attorney, Agent, or Firm*—Heslin & Rothernberg, P.C.

[57] ABSTRACT

Electronic semiconductor structures, and fabrication and sparing methods, each utilize an electrically programmable spare circuit incorporated with a multichip package. The programmable sparing capability in the multichip package is accomplished either with or without the inclusion of a spare chip(s). With a spare memory circuit, individual failed memory cells in the semiconductor chips of a stack can be functionally replaced by memory cells of the spare memory circuit subsequent to encapsulation and burn-in testing. With use of a spare chip, non-volatile sparing can occur subsequent to encapsulation and burn-in testing without physical rewiring of a wire bond connection. Specific details of alternate electronic semiconductor structures, and fabrication and sparing methods therefore, are set forth.

9 Claims, 7 Drawing Sheets

SEMICONDUCTOR STACK STRUCTURES AND FABRICATION/SPARING METHODS UTILIZING PROGRAMMABLE SPARE CIRCUIT

This application is a division of application Ser. No. 08/429,981 filed Apr. 27, 1995 which application is now: U.S. Pat. No. 5,798,282, and which itself is a divisional application of Ser. No. 08/220086 now U.S. Pat. No. 5,502,333, issued Mar. 26, 1996.

TECHNICAL FIELD

The present invention relates in general to high density electronic circuit packaging, and more particularly, to techniques for providing programmable sparing capability to a multichip package, either with or without the inclusion of a spare chip(s) in the multichip package.

BACKGROUND ART

The market for high density electronic circuit packages of multiple semiconductor chips continues to increase. Two common types of semiconductor chip stacks are the vertically-extending (or "pancake") stack and the horizontally-extending (or "breadloaf") stack.

U.S. Pat. Nos. 4,525,921 and 4,646,128 by Carson et al. disclose structure and fabrication techniques for producing one type of high density, multichip electronic package. These documents describe a semiconductor chip stack consisting of multiple integrated circuit chips adhesively secured together. A metallized pattern is provided on at least one side surface of the stack for electrical connection of the stack to external circuitry. This metal pattern typically includes both individual contacts and bussed contacts. The stack is positioned on an upper surface of a substrate so that electrical contact can be made between the stack metallization pattern and a substrate surface metallization pattern.

Various alternate stack structures and electrical interconnection possibilities have also been described. For example, reference U.S. patent application Ser. No. 08/000,826 entitled, "Multichip Integrated Circuit Packages and Systems," U.S. patent application Ser. No. 08/120,876, entitled "Integrated Multichip Memory Module, Structure and Fabrication," and U.S. patent application Ser. No. 08/120,993, entitled, "Integrated Memory Cube, Structure and Fabrication," which are all commonly assigned to the same assignee as the present invention, and which are all hereby incorporated herein by reference.

At least one redundant chip(s) is often provided in a semiconductor chip stack so that if one or more of the primary chips in the stack should fail following stack fabrication and/or stressing (i.e., burn-in), the redundant chip(s) may be "invoked" to provide the electronic circuit package with the desired performance level. This activity is referred to in the art as "sparing." Invoking of a redundant or spare semiconductor chip is typically physically accomplished at the package level of assembly, which normally entails wirebonding the chip to a lead frame and then encapsulating the entire assembly in a polymer material. Thus, burn-in and invoking of the redundant semiconductor chip ("sparing") in a multichip package must be performed prior to encapsulation and final testing of the semiconductor chip stack. Unfortunately, chip failure can occur during final stack packaging, in which case the resultant electronic circuit package must be discarded.

Conventional stack "breadloaf" sparing technology is based on provision of a programmable via in combination with a thin film metallization layer on a side-surface of an unpackaged semiconductor chip stack. Such technology enables access to the spare chip(s) in the stack while still maintaining a fixed pattern and fixed function solder bump array. Alternatively, additional stack side-face wiring channels may be employed to independently access a spare chip(s) in the semiconductor chip stack.

An important application of today's chip stacking technology is in the fabrication of computer memory systems. Traditionally, computer memory systems are assembled from many types of memory chips, such as DRAMs, SRAMs, EPROMs and EEPROMs. The number of storage devices per memory chip technology generation varies but increases over time with more devices per chip being delivered with each succeeding generation, thereby providing greater memory capacity. When a next generation memory chip becomes available, the number of chips needed to make a given memory system is correspondingly reduced. With fewer memory chips needed, the resultant memory system becomes physically smaller.

The next generation DRAM memory chips have traditionally increased by 4× the number of bits compared with current generation technology. For example, assume that the current generation of memory chips comprises 16 megabit (Mb) chips, then by industry standards the next generation comprises 64 Mb memory chips. This 4× advancement from one generation of memory chips to the next generation is typically accomplished with corresponding advancement in semiconductor tool and process technologies, for example, sufficient to attain a 2× reduction in surface geometries. Due to this interrelationship, a significant interval of time can pass between generations of memory chips. Therefore, a genuine improvement in memory system design and fabrication would be attained if current generation memory chips could be assembled to have the same functions and physical dimensions of an anticipated, next generation memory chip. The multichip memory packages and fabrication techniques presented in the above-incorporated patent applications provide such an improvement.

Experience has shown that burn-in stressing of semiconductor chips in a multichip package predominately results in only a few single bit (i.e., "memory cell") fails per failing semiconductor chip. For example, in a typical failed memory chip, there might be 10–15 memory cells in the chip which fail testing following burn-in stressing. Currently, there is no cost-effective technology to spare only these failed bits, particularly after the chip has been encapsulated; that is, at least not without providing a redundant semiconductor chip. Therefore, an entire semiconductor chip stack might have to be discarded because of only a few failed memory cells. Since single memory cell failures are the predominant mode of failure of a semiconductor chip's memory, an alternative stack sparing approach based on replacement of only the failed memory cell(s), rather than replacement of the entire semiconductor chip, would clearly have commercial advantages.

As another problem, most semiconductor random access memories (RAMs) utilize power-on latches which assume a state based on non-volatile data. Fuses, for instance, can be opened to influence latch state during power-up. Such circuit technologies are commonly used for memory array redundancy allocation. Unfortunately, in a high radiation flux environment, an ion impact episode may cause these redundancy latches to flip; thereby activating or deactivating random redundancy. Obviously, this could have catosphropic consequences to a memory dependent machine.

In general, various novel techniques for providing programmable sparing capability to a multichip package, either with or without the inclusion of a spare chip(s) in the multichip package, are presented herein. These techniques address each of the above-noted drawbacks of the existing multichip stack fabrication art.

DISCLOSURE OF INVENTION

Briefly described, the present invention comprises in one aspect an electronic semiconductor structure wherein a plurality of semiconductor chips are electrically coupled together to form a system. At least one semiconductor chip in the system has a memory with m memory cells, wherein m is an integer. A spare memory circuit having n memory cells is also provided, wherein n is an integer and $n \leq m$. The spare memory circuit is electrically connected to the plurality of semiconductor chips and is programmable such that single memory cells of the n memory cells of the spare memory circuit can functionally replace a single failed memory cell of the m memory cells of the at least one semiconductor chip in the system. If desired, the spare memory circuit could be provided physically separate from the plurality of semiconductor chips, or on a semiconductor chip comprising one of the plurality of semiconductor chips, or on each semiconductor chip of the plurality of semiconductor chips.

In another aspect, an electronic semiconductor structure is provided wherein a plurality of semiconductor chips are electrically coupled together to form a system. A controller circuit is electrically coupled to the system and contains non-volatile means for sparing the system by permanently selecting after encapsulation at least one semiconductor chip of the plurality of semiconductor chips to be active within the system.

In yet another aspect, a packaged electronic semiconductor structure is described wherein, again, a plurality of semiconductor chips are electrically coupled together in a packaged system. A spare circuit is mechanically and electrically coupled to the plurality of semiconductor chips so as to comprise part of the packaged system and electrical means are provided for activating the spare circuit to function in combination with the plurality of semiconductor chips in the packaged system.

In a further aspect, the invention comprises a method for sparing a packaged semiconductor device having multiple semiconductor chips each with a memory of m memory cells, wherein m is an integer. The device also includes a spare memory circuit having n memory cells, wherein n is an integer and $n \leq m$. The multiple semiconductor chips and the spare memory circuit are electrically coupled together. The sparing method includes the steps of: for each semiconductor chip of the multiple semiconductor chips, testing operability of and monitoring for failure at a memory cell of the m memory cells of the memory; and after detecting a failed memory cell, programming a memory cell of the n memory cells of the spare memory circuit to functionally replace the failed memory cell.

In still another aspect, the invention comprises a method for fabricating a multichip semiconductor package including: providing a plurality of semiconductor chips, each having two substantially parallel planar main surfaces; mechanically and electrically coupling together the plurality of semiconductor chips such that at least one planar main surface of each semiconductor chip is coupled to a planar main surface of an adjacent semiconductor chip; and providing and electrically coupling a controller circuit to the multichip semiconductor stack, the controller circuit including programmable, non-volatile means for sparing the multichip semiconductor stack.

To summarize, various techniques are discussed for sparing a stack subsequent to sealing a stack within a microelectronic package. Personalization of the package is thus attainable at final testing, along with permanent sparing thereof, for example, by using an electrical fuse array, non-volatile memory or an electrical programmable logic array. The programmable methodologies presented can also be used to invoke various logic functions such as I/O reconfiguration, error correction code (ECC), self-timed refresh, address reconfiguration, or any desired application specific function. When the logic function and selecting function are combined, the resultant circuitry can be incorporated almost anywhere within the stack.

In addition, techniques are presented for sparing a multichip package by replacing only failed memory bits, i.e., without the use of a redundant semiconductor chip in the stack. Thus, greater density is achieved, and fixed segmentation points in a large stack fabrication process are possible and cost-effective, while still maintaining high stack yield. Significant stack fabrication/test cost reductions are achieved by eliminating the need for functional, but not accessed, spare chips. Sparing of memory chip fails caused by ion bombardment after packaging is also possible.

Further, the invention enables the "up-grading" of non-conforming chips when incorporated into a multichip stack. Specifically, the invention can result in the replacement of failed memory cells from a DRAM stack with functional memory cells contained in a SRAM cache. Thus, the invention is not necessarily limited to simply replacing failed memory cells that occur during stressing. Rather, cell replacement can also occur for memory cells that fail due to other reasons, even to the extent of taking semiconductor chips that as single chips would be considered non-conforming, incorporating them into the stack, and replacing the failed memory cells in those chips with the SRAM macro cells. Further, the cell replacement technique presented is not restricted to DRAM chips. The invention can be applied to any number of technologies, including SRAM, flash, etc., for which sparing is needed for cost effective fabrication of a multichip package.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Broadly stated, the present invention comprises various electronic semiconductor structures and fabrication/sparing methods for improving multichip package yield, principally subsequent to encapsulation and burn-in of the package. More particularly, various multichip stack structures and packaging techniques are described for enhancing package yield by providing the capability to spare memory ranging in size from one or more memory cells to an entire chip or chips.

Reference is now made to the drawings, which are not drawn to scale for ease of understanding, wherein the same reference numbers used throughout different figures designate the same or similar components.

Figure 1:
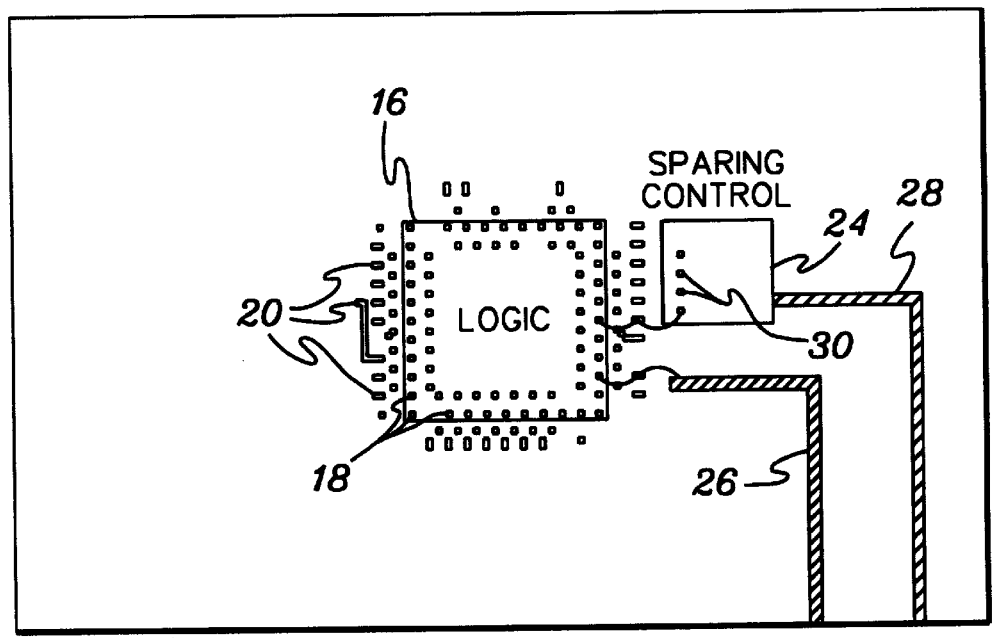
FIG. 1 is a partially exposed top view of a multichip package in accordance with one embodiment of the invention wherein a logic circuit and a non-volatile sparing controller are electrically coupled.
Figure 1A:
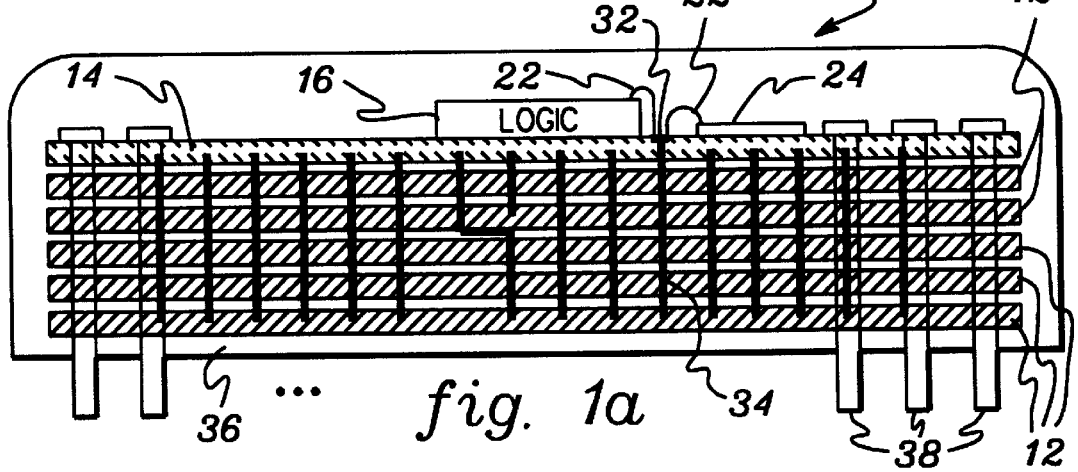
FIG. 1a is an exposed side elevational view of the multichip package of FIG. 1.
Figure 2:
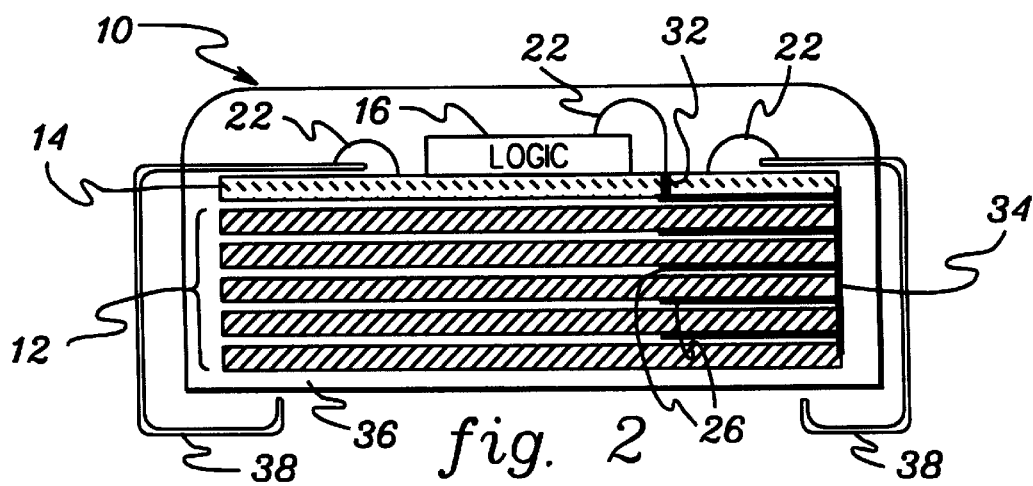
FIG. 2 is an exposed end elevational view of the multichip package of FIG. 1.
Figure 9:
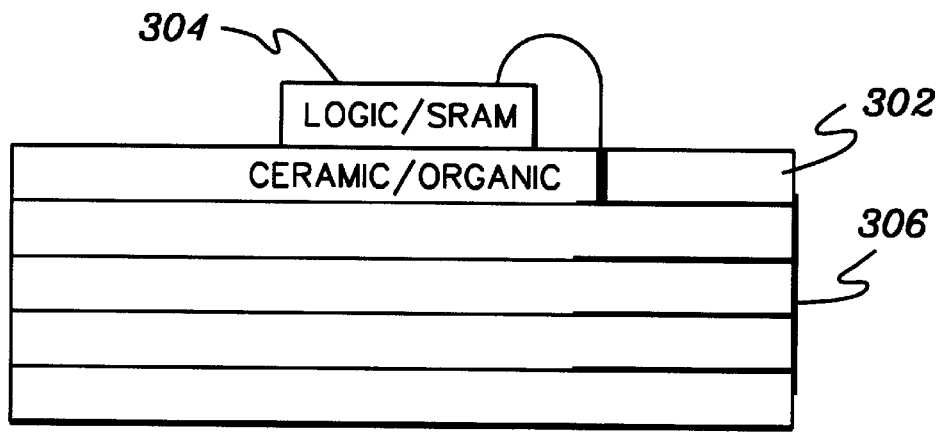
FIG. 9 is an elevational view of one stacking/packaging arrangement in accordance with the invention showing connection of a logic/SRAM chip to a multichip stack.
Figure 10:
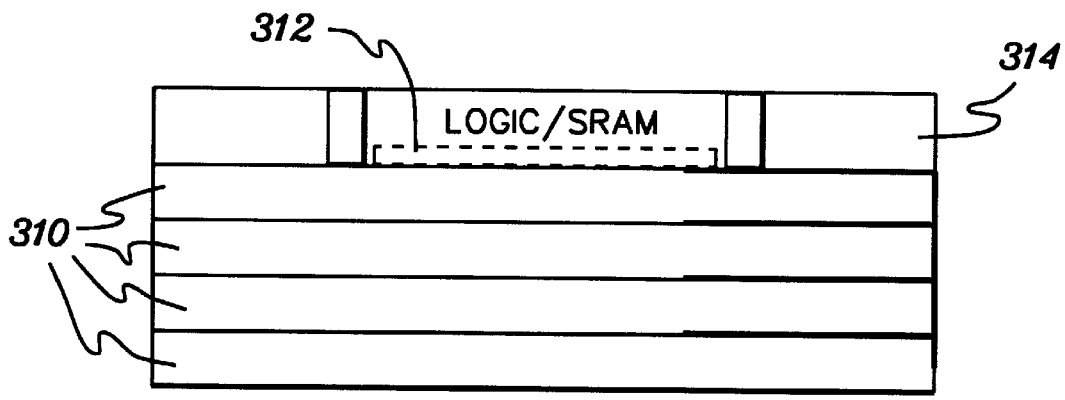
FIG. 10 is an elevational view of another stacking/packaging arrangement in accordance with the invention showing connection of a logic/SRAM circuit embedded within an endcap chip of a multichip stack.
Figure 11:
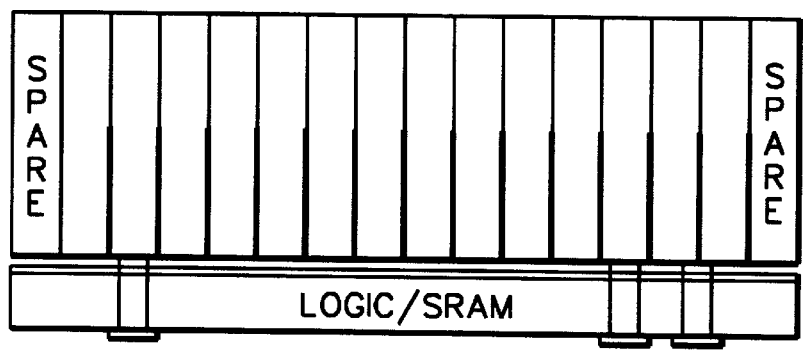
FIG. 11 is an elevational view of still another stacking/packaging arrangement in accordance with the invention showing connection of a logic/SRAM chip to a side-surface of a multichip stack.

FIGS. 1, 1a & 2 depict one embodiment of a multichip package, generally denoted 10, in accordance with the invention. Package 10 includes by way of example five identical-type integrated circuit chips 12, only four of which need to be active with the fifth chip comprising a redundant semiconductor chip. In one embodiment, each chip 12 may comprise a memory chip such as a 4 Mb dynamic random access memory (DRAM) chip. Semiconductor chips 12 are coupled together in a vertically-extending stack referred to in the art as a "pancake" configuration. An endcap 14, for example, fabricated of a ceramic or organic material, is disposed above an uppermost semiconductor chip 12 in the vertically-oriented stack. The multichip package depicted in FIGS. 1, 1a & 2 comprises an side outline J-lead (SOJ) package wherein encapsulant 36 surrounds the multichip stack and pins/lead frame 38 provide electrical connection to th e semiconductor chips of the stack. FIGS. 9–11 depict various alternate mechanical arrangements for interconnecting semiconductor chips to form a stack.

Disposed above endcap 14 is a logic circuit chip 16 and a non-volatile programming means, labelled "sparing control" 24, along with a multitude of pads 20 which electrically connect through endcap 14 by metallized via holes, such as metallized via 32, and appropriate transfer metallization 26 to side surface bussings 34. Bussings 34 electrically connect to the multiple chips 12 in the package. Pads 18 and 30 are also disposed above circuit chip 16 and sparing control chip 24, respectively. Traditional wire bond 22 can be used to interconnect chips 16 and 24 and to connect the chips to selected metallized Via holes (32) through endcap 14, for coupling to side surface metallization 34 via an appropriate transfer metallization 26 above the uppermost semiconductor chip 12 in the stack.

Wiring 26 extends outwardly to the stack's side surface bussings 34 and electrically connects thereto via, e.g., conventional T-connections (FIG. 2). Note that transfer metallization 26 may be employed to electrically contact to an active surface of an adjacent semiconductor chip or to electrically connect a metallized via 32 to side surface metallization 34 of the multichip package. One preferred approach to electrically connecting a semiconductor chip disposed on an end surface of a multichip stack is described in the above-incorporated application entitled "Multichip Integrated Circuit Packages and Systems," Ser. No. 08/000, 826.

Various implementations of the non-volatile programmable means, i.e., sparing control 24, are possible. Again, in this embodiment the goal of programmable means 24 is to provide a mechanism for selecting those semiconductor chips 12 to be active in the stack. More particularly, package 10 may be configured such that by default the four lowermost semiconductor chips in the stack are active, i.e., unless testing subsequent to encapsulation and burn-in establishes that one of these semiconductor chips is defective. In such a case, programming means 24 is activated to deselect the failed semiconductor chip and substitute therefore the uppermost semiconductor chip 12 in the stack. Obviously, this assumes that there is only one failed semiconductor chip in the multichip package. If desired, multiple redundant semiconductor chips could be incorporated into the stack prior to encapsulation. The decision whether to incorporate one or more redundant semiconductor chips into the stack can be based upon empirical yield data for the particular type semiconductor chips at issue. Alternatively, a "spare chip" not redundant of the particular type semiconductor chips at issue could be incorporated into the stack as described below. Programming of non-volatile program means 24 is electrically controlled after encapsulation through a programmable control bus 28.

Sparing of a multichip package after encapsulation and final testing can be accomplished using a number of different non-volatile programming means. For example, a first option might be to employ an electrical fuse array, either on a second silicon chip (e.g., chip 24) or by invoking a fuse array integrated with the logic circuit chip 16. Such fuses can be open circuited via programmable control lines connected to a spare package pin or multiplexed with functional package pins. For instance, package address pins can be used to "point" to specific fuses. Then by driving current through the pin(s), the fuse in question can be open circuited. With such a capability, the spare control 24 can be "permanently" (non-volatilely) directed to access only semiconductor chips of the stack which have tested functional subsequent to encapsulation and burn-in. Alternatively, non-volatile memory may be accessed via a spare package pin(s) to electrically program a data output configuration similar to that of a fuse network.

Figure 3:
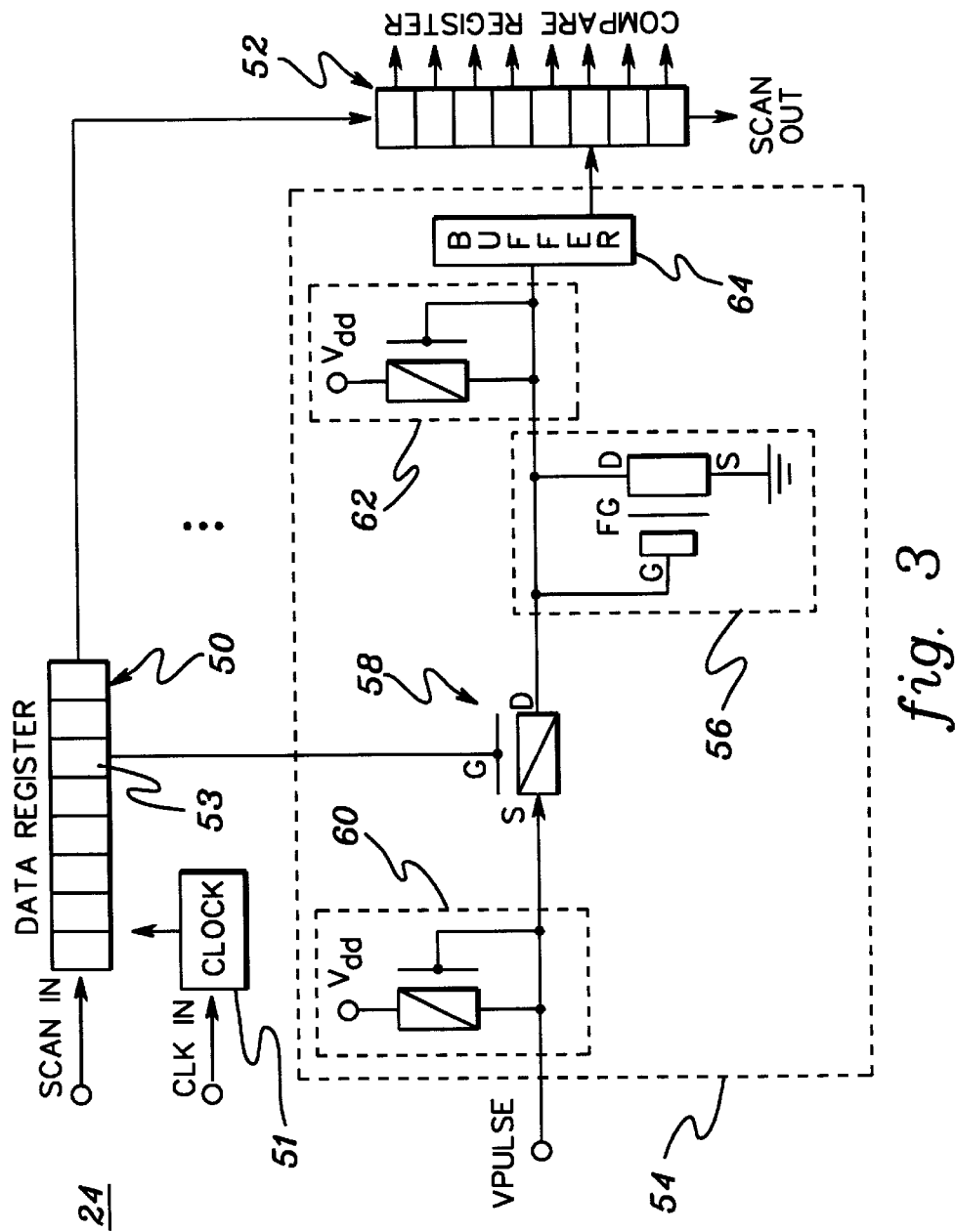
FIG. 3 is a schematic of one embodiment of a non-volatile spare circuit controller for the multichip package of FIG. 1.

The control circuit of FIG. 3, which presents still another non-volatile programming option, employs electrically programmable logic arrays (EPLAs) to program a sparing algorithm at final testing of the multichip package. This circuit includes complementary metal oxide semiconductor (CMOS) circuits with P-channel field-effect transistors (PFETs) indicated in the drawing by a rectangle with a diagonal line formed therein and a control element or gate electrode arranged adjacent thereto and with N-channel field-effect transistors (NFETS) indicated by a rectangle without a diagonal line and with a control element or gate electrode arranged adjacent thereto.

Data is scanned into a data register 50 at a rate dictated by a common clock 51. Coupled to data register 50 are a plurality of non-volatile logic circuits 54, only one of which is shown. Each bit location in data register 50, e.g., location 53, has a corresponding logic circuit 54 associated therewith. A zero '0' at the corresponding bit 53 of data register 50 forward biases a PFET 58, which permits a floating gate NFET 56 to receive an elevated voltage at its gate 'G' and drain 'D'. As a result, floating gate structure 56 absorbs hot electrons which increases the threshold voltage of the device, driving it to a permanently "off" state. A PFET 62 configured as a bleeder is connected to the drain 'D' of NFET 56 to ensure that the drain 'D' never floats. A buffer 64 is employed to amplify the floating gate network to CMOS levels for input to an appropriate bit of a compare register 52, which has 'n' bits that correspond to 'n' bits of data register 50. Programming of a '0' in the data register thus produces a '1' in the compare register. After programming, compare register 52 holds the logic vector for the sparing algorithm. Scan out can be used to verify programming accuracy.

The same non-volatile programming methodologies for substituting chips can be used to invoke various logic functions, collectively referred to herein as "feature circuits." Such logic functions, which can reside on logic chip 16 (FIG. 1), might include logic for I/O reconfiguration, ECC, self-timed refresh, address reconfiguration, or almost any application specific function desired. Thus, multichip package personalization may be completed on a customer-specific basis. The physical wiring of FIGS. 1, 1a & 2 supports test, burn-in and application, while FIG. 3 depicts an embodiment for programming final logic functions and selecting good chips without rewiring any electrical connection. When the logic function and the non-volatile selecting function are combined, the total system can be placed anywhere within the multichip stack, for example, reference FIGS. 10 and 11 (discussed below).

As noted initially, for certain applications it may be desirable to avoid the inclusion of one or more redundant semiconductor chip(s) in a multichip package, yet to still provide a sparing capability, particularly after encapsulation and burn-in of the package. This is because inclusion of a redundant semiconductor chip in a multichip stack necessarily results in a greater stack height (or length), more complex package side-surface wiring, additional test time and, ultimately, additional product cost.

The majority of today's multichip packages comprise memory modules wherein multiple memory chips are electrically and mechanically integrated within the package. Failure analysis has shown that testing subsequent to burn-in (i.e., after encapsulation) may result in failure of a memory chip at, for example, 5–15 memory cells of the memory array. Thus, another aspect of the present invention comprises the sparing of a multichip package after encapsulation, without the use of a redundant semiconductor chip within the stack, by substitution of individual functional memory cells for identified failed memory cells in one or more semiconductor chips of the multichip package.

Figure 4:
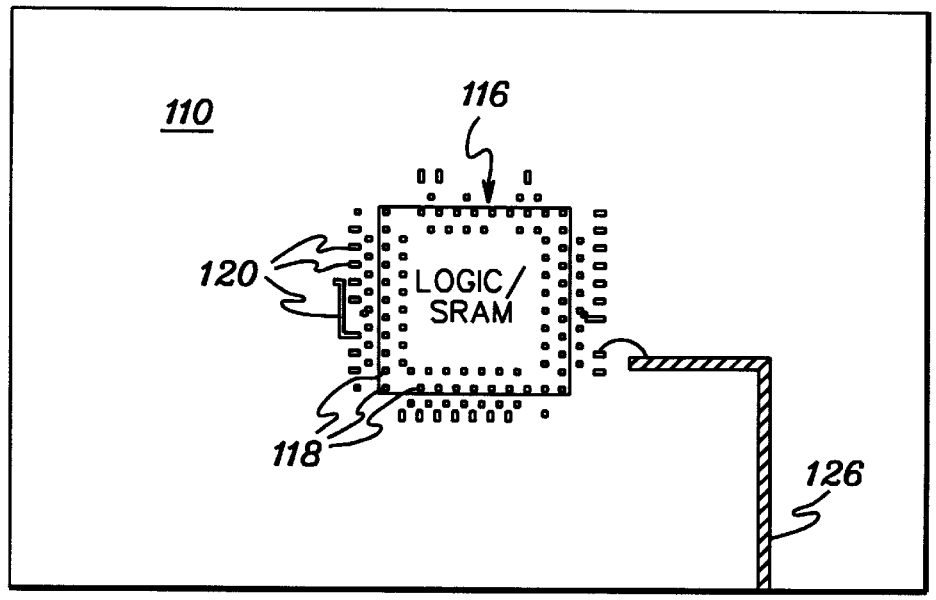
FIG. 4 is a partially exposed top view of another embodiment of a multichip package in accordance with the present invention wherein a logic/SRAM chip is affixed to an endcap chip of a semiconductor chip stack.
Figure 4A:
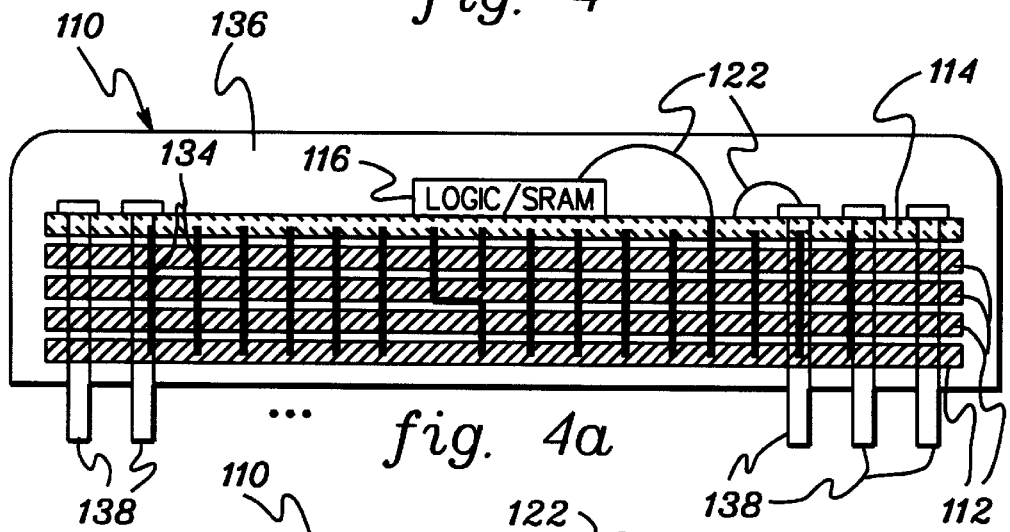
FIG. 4a is an exposed side elevational view of the multichip package of FIG. 4.
Figure 5:
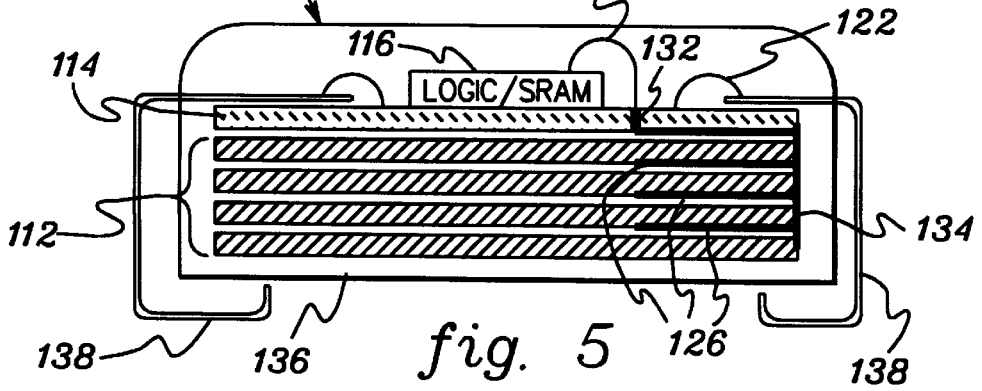
FIG. 5 is an exposed end elevational view of the multichip package of FIG. 4.

FIGS. 4, 4a & 5 depict one embodiment of a multichip stack, generally denoted 110, in accordance with this aspect of the invention. In this stack, four semiconductor chips 112 are mechanically connected such that at least one planar main surface of each memory chip is coupled to a planar main surface of an adjacent memory chip, resulting in the chips residing one above the other as shown in FIGS. 4a & 5. By way of example, package 110 could comprise four DRAM chips. However, the concepts described herein are equally applicable to other semiconductor chips, such as logic chips, wherein memory is included on at least one of the chips and a failed memory cell location is identified during post-burn-in testing.

In the embodiment shown, an endcap 114, positioned above the four semiconductor chips 112, has a logic/SRAM chip 116 affixed thereto. Analogous to endcap 14 of FIG. 1, endcap 114 facilitates electrical connection of chip 116 to semiconductor chips 112 via metallized vias 132 and transfer metallization 126. Chip 116 contains contact pads 118 on an upper surface thereof which can be wire bonded 122 to surrounding pads 120 disposed above endcap 114, such as shown. Pads 120 might be electrically connected to side surface metallizations 134 through connection to appropriate metallized vias 132 and transfer metallization 126. In this embodiment, the multichip package is encapsulated 136 to form an SOJ package having connection pins 138 extending therefrom.

Central to this aspect of the invention is the provision of programmable, spare memory cells (e.g., in the form of a SRAM macro) that are electrically connected to the multichip stack to provide substitute memory cells for failed memory cells in the stack. In the embodiment shown, the SRAM macro is integrated with a logic macro, which coordinates communication with the package via appropriate addressing and I/O buffering logic. One embodiment of such a logic chip is described in the above-incorporated U.S. patent application entitled "Integrated Multichip Memory Module, Structure and Fabrication," Ser. No. 08/120,876. However, it is important to note that the spare memory cells could be disposed anywhere within the multichip stack, including on each semiconductor chip of the stack or on a dedicated semiconductor chip integrated with the multichip stack.

By way of overview, the SRAM macro provides access to spare memory cells at retrieval rates equal to or greater than access rates to the semiconductor chips of the stack, e.g., dynamic random access memory (DRAM) chips. This is accomplished by storing the address of a failed memory cell location in the logic/SRAM chip by some means of non-volatile data recordation, such as, but not limited to, an electrically programmable fuse bank. The fuse bank stores the complete fail pattern for the multichip stack as address information. Then during normal stack access, incoming address information is compared with the stored failed cell patterns, and in the event of a valid compare, the SRAM is activated for a read or write of data through the I/O buffering logic. Simultaneously, the DRAM stack data is disabled.

An integrated multichip memory package in accordance with the invention can be implemented using any of a variety of available memory chip architectures. For example, four 16 Mb DRAMs can be assembled into a memory stack which can emulate exactly a next generation memory chip, i.e., a 64 Mb DRAM (in this regard, reference the above-incorporated application entitled "Integrated Multichip Memory Module, Structure and Fabrication," Ser. No. 08/120,876). The integrated function is accomplished by associating control logic chip 116 with the stack of four memory chips (FIG. 4a). Preferably the resultant module of four 16 Mb DRAMs plus logic chip can be sized to fit into an industry standard 64 Mb package, or if desired, a smaller package. Sparing capabilities in accordance with this aspect of the present invention facilitates achieving the goal.

Figure 6:
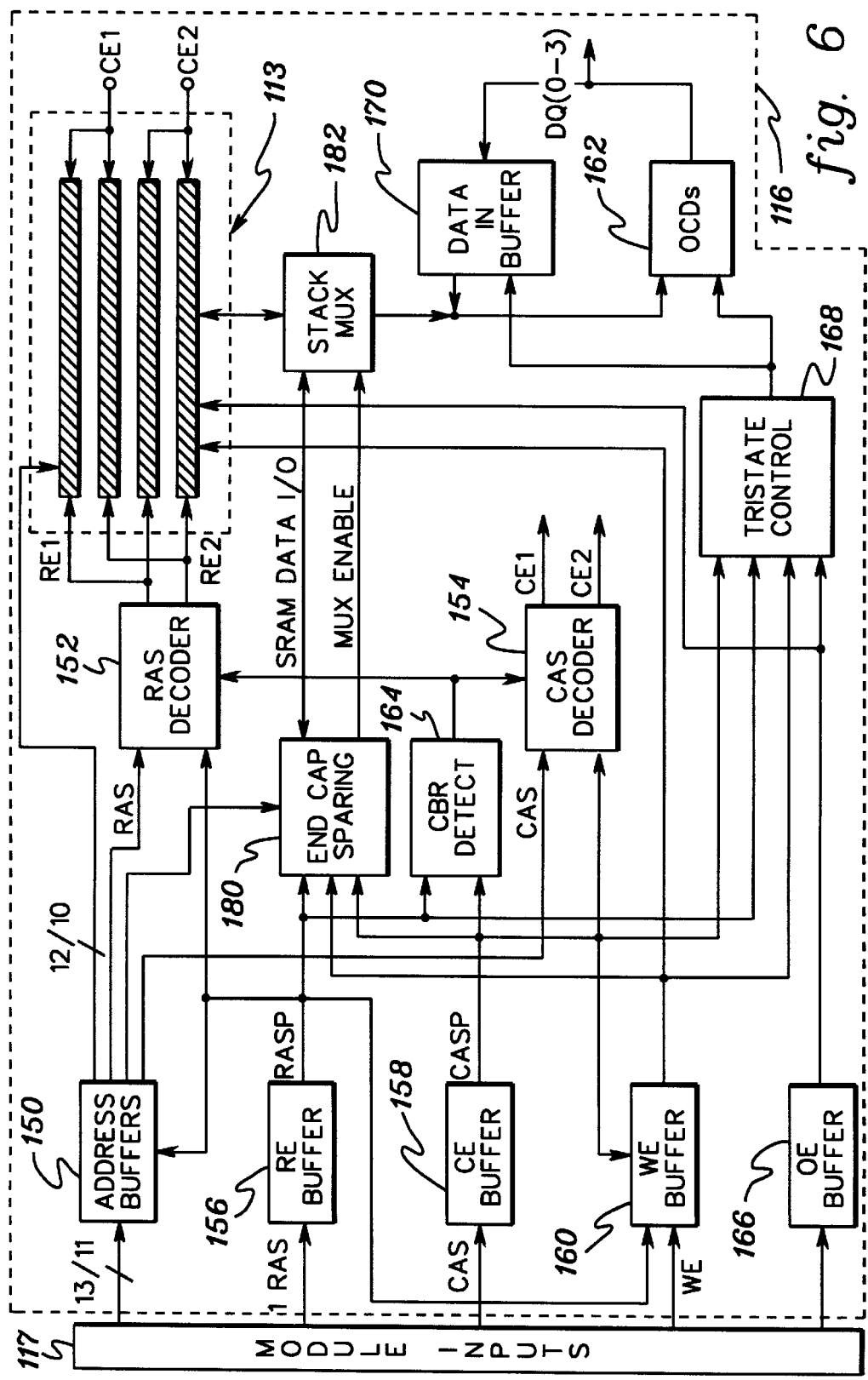
FIG. 6 is a block diagram representation of one embodiment of a logic/SRAM circuit in accordance with the invention for the multichip package of FIG. 4.

An overview of one embodiment of a control logic circuit/SRAM 116 in accordance with this aspect of the invention is depicted in FIG. 6. Logic circuit 116 receives address and control inputs 117 from a memory controller (not shown) or other external processing unit. In this example, logic/SRAM circuit 116 is designed to industry standards for a next generation, single memory chip's input timings. For example, if the semiconductor memory chips in the stack 113 comprise 64 Mb memory chips, then logic 116 would have the same I/O characteristics as a 256 Mb single memory chip.

As a further example, 4 Mb×4 12/10 addressable memory chips might be used to define multichip package 110 (FIG. 4a). In such a case, each chip provides ¼ of a 64 Mb memory array. Assume further that a desired product is a 13/11 addressable, 16 Mb×4 array. With such an input, 13 bits would enter address buffers 150. Thus, a 12 bit signal is passed from address buffers 150 to stack 113. During RAS time, one bit of the incoming thirteen address bits is split off and fed to a RAS decoder 152. Similarly, during CAS time, one bit of the received eleven bit signal is split off and fed to a CAS decoder 154. RAS and CAS timing pulses are received by a RAS enable buffer 156 and a CAS enable buffer 158, respectively, from module inputs 117.

Output from RE buffer 156 is a RASP signal comprising a RAS pulse, positive active high. This pulse is output from RE buffer 156 whenever the buffer detects its input going low. The signal is also fed to address buffers 150 to enable/disable the address buffers. Similarly, output CASP from CE buffer 158 is fed to a write enable buffer 160 to provide enable/disable control. Output from RAS enable buffer 156 and one address from address buffers 150 are fed to RAS decoder 152, which outputs two signals RE1 and RE2. Together, these signals select two of the four memory chips in stack 113. Only signal RE1 or signal RE2 has an applied voltage (i.e., is in an active state) based upon the inputs received by RAS decoder 152.

Note that the approach to selecting a particular semiconductor chip is dependent upon the architecture employed. For example, if an 11/11 4 Mb×4 semiconductor chip is used then two bits would be required for input to the RAS decoder. Upon receipt of an appropriate RASP pulse, one of the four semiconductor chips would be directly selected by the RAS decoder. In such a case, the CAS decoder output would be connected to all four chips in stack 113. However, with 12/10 16 Mb chips, CAS decoder 154 will need to output one of two signals CE1 and CE2. Signals CE1 and CE2 are fed back to the memory chips of stack 113 in an interleaved fashion relative to signals RE1 and RE2. Thus, at RAS time, two of the four semiconductor chips are selected and at CAS time one of the two previously selected chips is identified as containing the particular address to be accessed by the 12/10 address signal forwarded from address buffers 150 to the stack. The appropriate four data bits from the selected memory chip will then be accessed and output via off-chip drivers (OCDs) 162 to a main data bus DQ (0–3).

A comparator can be employed as a CBR detector circuit 164 to identify the JEDEC standard timing of when a CAS pulse occurs before a RAS pulse. Such an ordering occurs when the memory controller (or system controller) directs that a memory refresh should occur. Each memory chip in stack 113 contains self-addressing refresh circuitry implemented in a manner well known in the art.

In addition to write enable buffer 160, an output enable buffer 166 receives pulse signals from the external source.

Outputs from buffers 156, 158, 160 and 166 are fed to a conventional tristate control 168 which feeds off chip drivers (OCDs) 162 and a data in buffer 170. Tristate control 168 deselects the data in buffer 170 when an output is being driven to bus DQ (0–3) or, alternatively, turns off OCDs 162 when data is being received at buffer Timing and control logic 116 is in addition to the standard logic and timing circuits inherent on the 16 Mb semiconductor memory chips in stack 113. Logic circuit 116 comprises a control logic circuit designed to emulate a single semiconductor memory chip, in this case a 64 Mb chip. Thus, for this particular implementation, logic circuit 116 is designed with two constraints. The first constraint comprises the known architecture of the selected memory chips in the stack, and the second constraint comprises the JEDEC standard operation of the next generation chip, in this case a 64 Mb chip. Further, note that logic circuit 116 can be employed in different memory I/O configurations.

In accordance with the present invention, logic circuit 116 includes a sparing circuit 180 and a stack multiplexer 182. Sparing circuit 180 contains in non-volatile storage the addresses of failed memory cells in the semiconductor chips comprising stack 113. Circuit 180 receives each address signal and continuously compares these signals with the stored failed cell addresses. When a positive comparison is encountered, meaning a failed memory cell is desired to be accessed, sparing circuit 180 directs that data is to be read from or written to a corresponding SRAM location substituting for the failed memory cell. In such a case, a "mux enable" signal is fed to stack multiplexer 182 to disable the I/O path from stack 113 to data in buffer 170 and OCDs 162. The SRAM data location then receives or outputs data through stack mux 182 and buffer 170 or OCDs 162, respectively.

Figure 7:
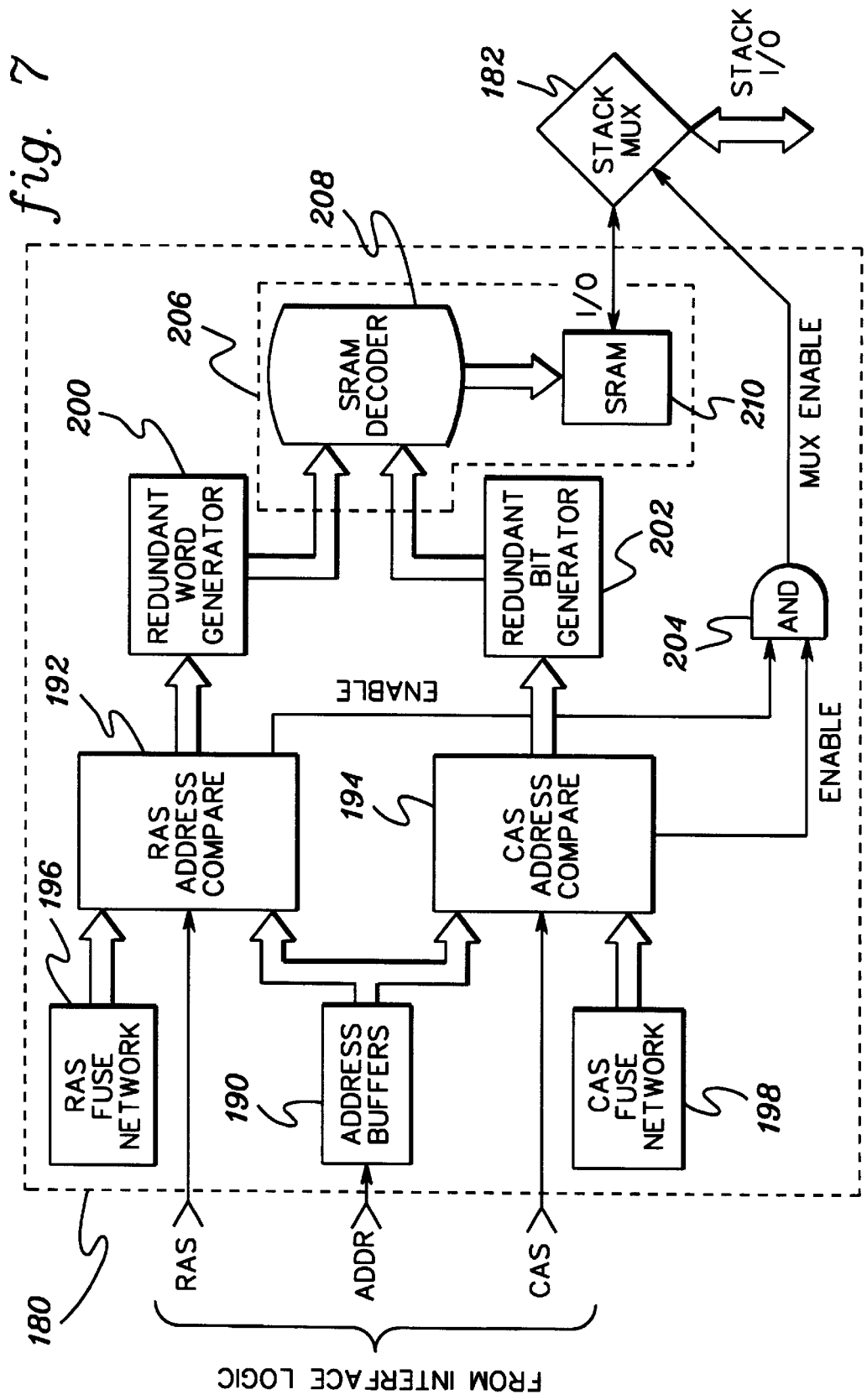
FIG. 7 is a block diagram representation of one embodiment of a sparing circuit in accordance with the invention for the logic/SRAM circuit of FIG. 6.

One embodiment of sparing circuit 180 is presented in FIG. 7. In this embodiment, circuit 180 receives address signals 'ADDR' at address buffers 190 from which the row and column portions of the address signals are extracted and compared at a RAS address compare 192 and a CAS address compare 194, respectively. The compare circuitry also receives as input a preprogrammed pattern from a RAS fuse network 196 and a CAS fuse network 198 as shown. Comparisons are driven by the RAS enable signal 'RAS' and CAS enable signal 'CAS'. Fuse networks 196 and 198 are provided herein only by way of example. Any volatile or non-volatile memory means could be employed to store an address pattern representative of one or more failed memory cell locations within the multichip stack. However, non-volatile storage means is preferred. Fuse networks 196 and 198 can be programmed prior to encapsulation using any number of conventional technologies, such as laser fusing. After encapsulation, the fuse networks can be tailored using alternative technologies such as electrical fusing, a non-volatile memory array, or an electrically programmable logic array (discussed above).

If a present address does correspond to a previously encoded failed memory cell location, then a redundant word generator 200 and a redundant bit generator 202 are activated to access the spare memory cell. Outputs from redundant word generator 200 and redundant bit generator 202 are tied to a SRAM decoder 208, through which SRAM 210 is accessed. Input/output (I/O) is fed between SRAM 210 and stack multiplexer 182. As previously noted, a "mux enable" signal switches I/O through stack mux 182 between the multichip stack and the SRAM resident in the sparing circuit 180. The "mux enable" signal is generated from AND logic 204, which receives as input an enable signal from both RAS address compare 192 and CAS address compare 194 when these circuits have comparisons that are 'valid'. Thus, stack mux 182 disables I/O to the multichip stack whenever both the RAS and CAS address signals are found to positively compare with preprogrammed memory cell locations in networks 196 and 198.

Figure 8:
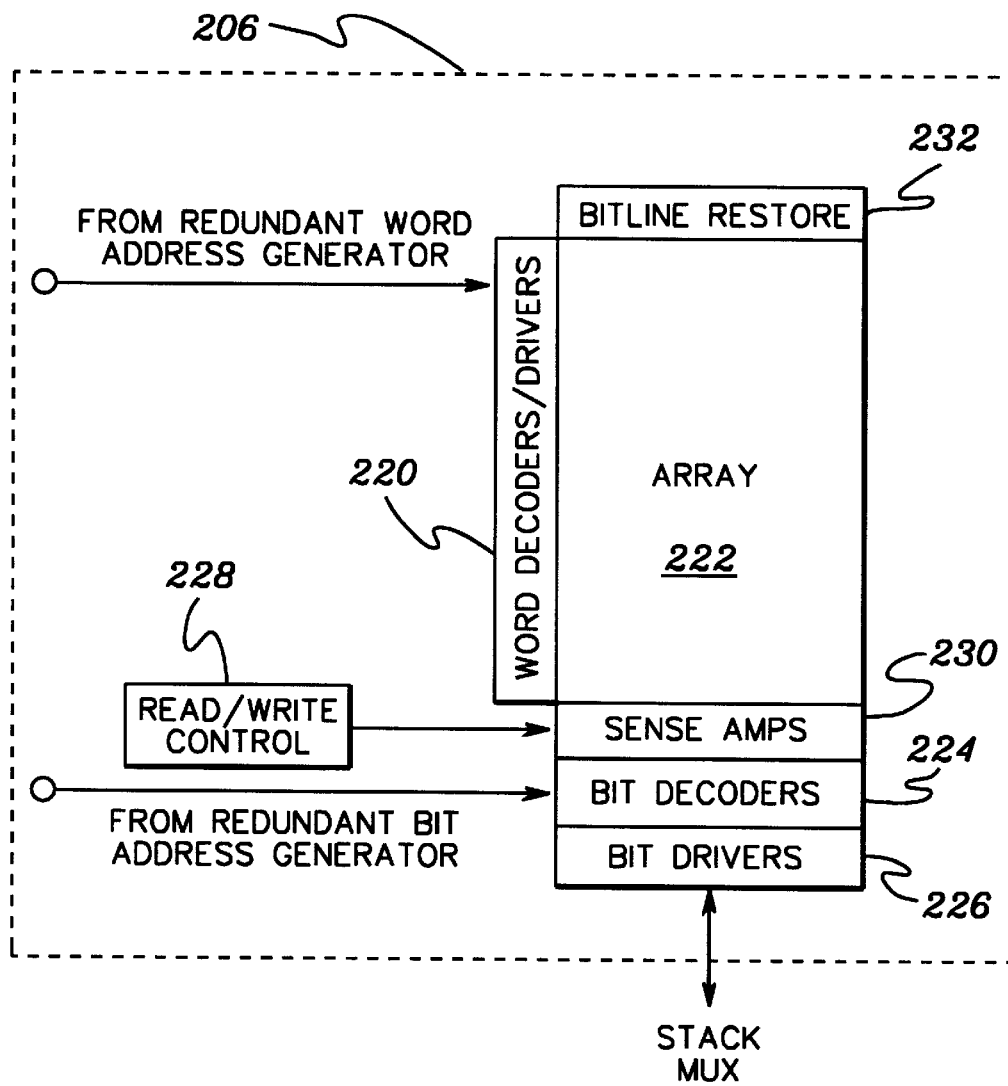
FIG. 8 is a block diagram representation of one embodiment of a SRAM decoder and SRAM circuit for the sparing circuit of FIG. 7.

FIG. 8 depicts a more detailed block diagram embodiment of the circuitry 206 comprising SRAM decoder 208 and SRAM 210. As shown, input from redundant word generator 200 comprises a word address which is fed to word decoders/drivers 220 coupled to a memory cell array 222. Similarly, output from redundant bit generator 202 is fed to bit decoders 224 and bit drivers 226 for accessing of a preprogrammed memory cell location within memory cell array 222. A read/write operation is signaled through a read/write control 228, and sense amps 230 associated with memory cell array 222. A conventional bit line restore circuit 232 completes the block diagram embodiment of circuitry 206. Again, I/O occurs through the stack mux 182 (FIG. 7).

Fabrication of an integrated multichip package in accordance with either the redundant chip approach or the spare circuit approach can be accomplished using any number of available multichip packaging methodologies. For example, FIG. 9 depicts an elevational view of a logic/SRAM implementation in accordance with the invention wherein a vertically-oriented multichip ("pancake") stack includes an endcap 302, above which a logic/SRAM chip 304 is disposed. Encap 302 can be fabricated of a number of materials, including silicon, ceramic or organic material. Chip 304 is electrically connected to side-surface metallization 306 via metallized via holes in endcap 302 and appropriate transfer metallurgy extending to the side-surface metallization 306.

FIG. 10 depicts an alternate embodiment wherein multiple semiconductor chips 310 are mechanically and electrically coupled to a logic/SRAM circuit 312 embedded within an endcap chip 314 such that the active surface of the chip faces downward, towards chips 310 of the stack. Electrical connection to this circuitry is possible through metallized via holes in the endcap chip, or appropriate transfer metallurgy to side-surface metallization 316 on the semiconductor chip stack. Fabrication of such an active side down chip and multichip package is presented in U.S. Pat. No. 5,270,261 entitled "Three-Dimensional Multichip Package Methods of Fabrication," which is hereby expressly incorporated herein by reference.

FIG. 11 depicts still another fabrication example wherein the multichip package comprises a horizontally-oriented stack with the control logic/SRAM circuitry mechanically and electrically coupled to the stack along a side-surface of the multichip package. Active stack bussing and sparing metallurgy can be formed in opposing metallization layers such as described in the above-incorporated patent and pending applications. Again, metallized via holes can be employed to electrically connect to the active surface of control logic/SRAM circuitry and/or to metallized bussing on the side-surface of the horizontally-extending stack.

Other multichip stack configurations will occur to those skilled in the art based upon the description provided herein. The appended claims are intended to encompass all such package modifications.

In summary, one skilled in the art will note from the above-description that various techniques are presented for sparing a multichip package subsequent to encapsulation and burn-in of the package. Personalization of the package is thus attainable at final testing, along with permanent sparing thereof, for example, by using an electrical fuse array, non-volatile memory or an electrical programmable logic array. The programmable methodologies presented can also be used to invoke various logic functions such as I/O reconfiguration, ECC, self-timed refresh, address reconfiguration, or any desired application specific function. When the logic function and selecting function are combined, the resultant circuitry can be incorporated almost anywhere within the stack.

In addition, techniques are presented for sparing a multichip package by replacing only failed memory bits, i.e., without the use of a redundant semiconductor chip in the stack. Thus, greater density is achieved, and fixed segmentation points in a large stack fabrication process are possible and cost-effective, while still maintaining high stack yield. Significant stack fabrication/test cost reductions are achieved by eliminating the need for functional, but not accessed, spare chips. In addition, sparing of memory chip fails caused by ion bombardment after packaging is also possible.

Further, the invention enables the "up-grading" of non-conforming chips when incorporated into a multichip stack. Specifically, the invention can result in the replacement of failed memory cells from a DRAM stack with functional memory cells contained in a SRAM cache. Thus, the invention is not necessarily limited to simply replacing failed memory cells that occur during stressing. Rather, cell replacement can also occur for memory cells that failed due to other reasons, even to the extent of taking semiconductor chips that as single chips would be considered non-conforming, incorporating them into the stack, and replacing the failed memory cells in those chips with the SRAM macro cells. Further, the cell replacement technique presented is not restricted to DRAM chips. The invention can be applied to any number of technologies, including (but not limited to) SRAM, flash, etc., for which sparing is needed for cost effective fabrication of a multichip package.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A method for fabricating a multichip semiconductor package, said method comprising the steps of:
   (a) providing a plurality of semiconductor chips, each semiconductor chip of said plurality of semiconductor chips having two substantially parallel planar main surfaces;
   (b) mechanically and electrically coupling together said plurality of semiconductor chips such that at least one planar main surface of said each semiconductor chip is coupled to a planar main surface of an adjacent semiconductor chip, wherein a multichip semiconductor stack is formed; and
   (c) providing and electrically coupling a controller circuit to the multichip semiconductor stack, said controller circuit including programmable non-volatile means for sparing the multichip semiconductor stack.

2. The method of claim 1, further comprising sparing the multichip semiconductor stack by permanently selecting at least one semiconductor chip of the plurality of semiconductor chips to be active within the multichip semiconductor stack, step of said sparing being accomplished via said programmable, non-volatile means for sparing.

3. The method of claim 1, wherein said controller circuit further includes a logic circuit, and wherein said method further comprises the step of electrically activating said logic circuit to function in combination with at least one semiconductor chip of the plurality of semiconductor chips, step of said electrical activating being accomplished without physical rewiring of an electrical connection of the multichip semiconductor stack.

4. The method of claim 1, further comprising the steps of:
   (d) encapsulating or sealing said multichip semiconductor stack to form said multichip semiconductor package;
   (e) burn-in testing of said semiconductor multichip package and monitoring for semiconductor chip failure among said plurality of semiconductor chips; and
   (f) after detecting said semiconductor chip failure, electrically programming said controller circuit to deselect each failed semiconductor chip utilizing said programmable non-volatile means for sparing the multichip semiconductor stack.

5. A method for fabricating a multichip semiconductor package, said method comprising the steps of:
   (a) providing a plurality of semiconductor chips, each semiconductor chip of said plurality of semiconductor chips having two substantially parallel planar main surfaces;
   (b) mechanically and electrically coupling together said plurality of semiconductor chips such that at least one planar main surface of each semiconductor chip is coupled to a planar main surface of an adjacent semiconductor chip, wherein a multichip semiconductor stack is formed; and
   (c) providing a controller circuit to the multichip semiconductor stack, said controller circuit including programmable non-volatile means for sparing the multichip semiconductor stack.

6. The method of claim 5, wherein said providing (c) comprises providing said controller circuit as one semiconductor chip of said plurality of semiconductor chips mechanically and electrically coupled together in said multichip semiconductor stack.

7. The method of claim 5, further comprising sparing the multichip semiconductor stack by permanently selecting at least one semiconductor chip of the plurality of semiconductor chips to be active within the multichip semiconductor stack, said sparing being accomplished via said programmable, non-volatile means for sparing.

8. The method of claim 5, wherein said controller circuit further includes a logic circuit, and wherein said method further comprises the step of electrically activating said logic circuit to function in combination with at least one semiconductor chip of the plurality of semiconductor chips, said electrical activating being accomplished without physical rewiring of an electrical connection of the multichip semiconductor stack.

9. The method of claim 5, further comprising the steps of:
   (d) encapsulating or sealing said multichip semiconductor stack to form said multichip semiconductor package;
   (e) burn-in testing of said semiconductor multichip package and monitoring for semiconductor chip failure among said plurality of semiconductor chips; and
   (f) after detecting semiconductor chip failure, electrically programming said controller circuit to deselect each failed semiconductor chip utilizing said non-volatile means for sparing the multichip semiconductor stack.

* * * * *

UNITED STATES PATENT AND TRADEMARK OFFICE
CERTIFICATE OF CORRECTION

PATENT NO. : 5,946,545
DATED : August 31, 1999
INVENTOR(S) : Bertin et al

It is certified that error appears in the above-identified patent and that said Letters Patent is hereby corrected as shown below:

ON THE TITLE PAGE:

Item [73] Assignee: Delete "Internatinal" and replace with --International--.

Col. 10, line 6, after "buffer", insert --170.--.

IN THE CLAIMS:

Claim 2, Col. 12, line 66, delete "step of said" and replace with --said step of--.

Signed and Sealed this

First Day of February, 2000

Attest:

Attesting Officer

Q. TODD DICKINSON

Acting Commissioner of Patents and Trademarks